US011138069B2

(12) United States Patent
Perlmutter et al.

(10) Patent No.: US 11,138,069 B2
(45) Date of Patent: Oct. 5, 2021

(54) PROVIDING ADDITIONAL PARITY FOR NON-STANDARD SIZED PARITY DATA SETS

(71) Applicant: Seagate Technology LLC, Cupertino, CA (US)

(72) Inventors: Stephen H. Perlmutter, Louisville, CO (US); Steven S. Williams, Longmont, CO (US); Benjamin J. Scott, Longmont, CO (US); Andrew J. Louder, Longmont, CO (US); Kyumsung Lee, Louisville, CO (US); Robert W. Dixon, Longmont, CO (US)

(73) Assignee: Seagate Technology, LLC, Cupertino, CA (US)

( * ) Notice: Subject to any disclaimer, the term of this patent is extended or adjusted under 35 U.S.C. 154(b) by 0 days.

(21) Appl. No.: 16/212,242

(22) Filed: Dec. 6, 2018

(65) Prior Publication Data
US 2019/0377633 A1 Dec. 12, 2019

Related U.S. Application Data

(60) Provisional application No. 62/683,393, filed on Jun. 11, 2018.

(51) Int. Cl.
*G06F 11/00* (2006.01)
*G06F 11/10* (2006.01)
(Continued)

(52) U.S. Cl.
CPC .......... *G06F 11/1068* (2013.01); *G11C 29/52* (2013.01); *H03M 13/2906* (2013.01)

(58) Field of Classification Search
None
See application file for complete search history.

(56) References Cited

U.S. PATENT DOCUMENTS 7,739,576 B2 6/2010 Radke
7,809,994 B2 10/2010 Gorobets
(Continued)

OTHER PUBLICATIONS

Y. Qin, D. Feng, J. Liu, W. Tong, Y. Hu and Z. Zhu, "A Parity Scheme to Enhance Reliability for SSDs," 2012 IEEE Seventh International Conference on Networking, Architecture, and Storage, 2012, pp. 293-297, doi: 10.1109/NAS.2012.40. (Year: 2012).*

*Primary Examiner* — Daniel F. McMahon
(74) *Attorney, Agent, or Firm* — Hall Estill Law Firm

(57) ABSTRACT

Apparatus and method for storing data in a non-volatile memory (NVM), such as a flash memory in a solid-state drive (SSD). In some embodiments, a distributed storage space of the NVM is defined to extend across a plural number of regions of the NVM. A non-standard parity data set is provided having a plural number of data elements greater than or equal to the plural number of regions in the storage space. The data set is written by storing a first portion of the data elements and a first parity value to the plural number of regions and a remaining portion of the data elements and a second parity value to a subset of the plural number of regions. The regions can comprise semiconductor dies in a flash memory, and the distributed storage space can be a garbage collection unit formed using one erasure block from each flash die.

20 Claims, 6 Drawing Sheets

(51) Int. Cl.
  *G11C 29/52*      (2006.01)
  *H03M 13/29*      (2006.01)

(56) References Cited

U.S. PATENT DOCUMENTS

| | | |
|---|---|---|
| 7,844,772 B2 | 11/2010 | Moon et al. |
| 7,877,541 B2 | 1/2011 | Norman |
| 8,001,450 B2 | 8/2011 | Onishi et al. |
| 8,255,617 B2 | 8/2012 | Goss et al. |
| 8,364,886 B2 | 1/2013 | Goss |
| 8,448,045 B2 | 5/2013 | Reddy et al. |
| 8,914,597 B2 | 12/2014 | Benhase et al. |
| 9,201,728 B2 | 12/2015 | Patapoutian et al. |
| 9,244,766 B2 | 1/2016 | Patapoutian et al. |
| 9,274,882 B2 | 3/2016 | Camp et al. |
| 9,430,329 B2 | 8/2016 | Trantham |
| 9,559,725 B1 | 1/2017 | Shao et al. |
| 9,905,294 B1 | 2/2018 | Canepa et al. |
| 10,140,215 B1* | 11/2018 | Canepa ............... G06F 3/0613 |
| 2009/0132620 A1 | 5/2009 | Arakawa |
| 2011/0231597 A1 | 9/2011 | Lai et al. |
| 2014/0281814 A1* | 9/2014 | Vogan ............... G06F 11/1004 |
| | | 714/766 |
| 2016/0299812 A1* | 10/2016 | Olbrich ............ G06F 11/1048 |
| 2016/0299844 A1* | 10/2016 | Sprouse ........... G06F 11/1048 |
| 2016/0301427 A1* | 10/2016 | Sprouse ............ G11C 29/028 |
| 2017/0269992 A1* | 9/2017 | Bandic .............. G06F 11/108 |
| 2017/0329532 A1 | 11/2017 | Goss et al. |
| 2018/0275899 A1 | 9/2018 | Munsil et al. |
| 2018/0351582 A1* | 12/2018 | Canepa ............ G06F 11/1012 |
| 2019/0095281 A1* | 3/2019 | Pioch ................... G11C 29/52 |

\* cited by examiner

PROVIDING ADDITIONAL PARITY FOR NON-STANDARD SIZED PARITY DATA SETS

RELATED APPLICATION

The present application makes a claim of domestic priority to U.S. Provisional Patent Application No. 62/683,393 filed Jun. 11, 2018, the contents of which are hereby incorporated by reference.

SUMMARY

Various embodiments of the present disclosure are generally directed to the management of data in a memory, such as but not limited to a flash memory in a solid state drive (SSD).

In some embodiments, a method includes arranging a distributed storage space of a non-volatile memory (NVM) across a plural number of regions. A non-standard parity data set having a plural number of data elements greater than or equal to the plural number of regions is written to the distributed storage space by storing a first portion of the data elements and a first parity value to the plural number of regions, and a remaining portion of the data elements and a second parity value to a subset of the plural number of regions.

In other embodiments, a method includes forming a garbage collection unit (GCU) across a plural number of dies characterized as semiconductor non-volatile memory (NVM) dies. A data set is divided into a plural number of data payload elements equal to or greater than the plural number of dies. A first portion of the data payload elements are combined to form a first parity value, and the first portion of the data payload elements and the first parity value are distributed across the plural number of dies. A remaining second portion of the data payload elements are combined to form a second parity value, and the remaining second portion of the data payload elements and the second parity value are distributed across less than the plural number of dies. Map data are written to a memory to describe the locations of the first and second parity values among the plural number of dies.

In further embodiments, a data storage device has a non-volatile memory (NVM) having semiconductor dies arranged into at least one garbage collection unit (GCU). The at least one GCU includes an erasure block selected from each of a plural number of the dies. A controller circuit is configured to write a non-standard parity data set to the at least one GCU. The parity data set has a plural number data elements greater than or equal to the plural number of the dies. The parity data set is written by storing an initial set of the data elements and a first parity value to each of the plural number of the dies, and by storing a remaining set of the data elements and a second parity value to a subset of the dies. The first parity value protects the initial set of the data elements, and the second parity value protects the remaining set of the data elements.

These and other features which may characterize various embodiments can be understood in view of the following detailed discussion and the accompanying drawings.

DETAILED DESCRIPTION

Figure 1:
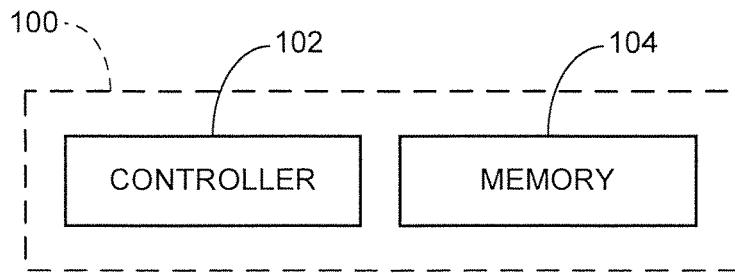
FIG. 1 provides a functional block representation of a data storage device in accordance with various embodiments.

Without limitation, the various embodiments disclosed herein are generally directed to providing additional parity for portions of cyclical payloads that span more than a given die set.

Solid state drives (SSDs) are data storage devices that store user data in non-volatile memory (NVM) made up of an array of solid-state semiconductor memory cells. SSDs usually have an NVM module and a controller. The controller controls the transfer of data between the NVM and a host device. The NVM will usually be NAND flash memory, but other forms of solid-state memory can be used.

A flash memory module may be arranged as a series of dies. A die represents a separate, physical block of semiconductor memory cells. The controller communicates with the dies using a number of channels, or lanes, with each channel connected to a different subset of the dies. Any respective numbers of channels and dies can be used. One non-limiting example provides a flash memory module with 128 dies and eight (8) lanes, so that 16 dies are connected to each of the eight channels.

Generally, only a single die out of all of the dies connected to a particular channel can be accessed at a given time, although concurrent accesses can take place using all of the channels at the same time, so long as only one die is being accessed by each channel. Groups of dies may be arranged into NVMe sets in accordance with the NVMe (Non-Volatile Memory Express) Standard. This standard enables multiple owners (users) to access and control separate portions of a given SSD (or other memory device).

Each of the dies are subdivided into smaller groupings or structures such as planes, garbage collection units (GCUs), erasure blocks, pages, etc. Pages are the smallest amount of memory that can be written or read at a time. Multiple pages are arranged into erasure blocks, which are the smallest unit of memory that can be erased at a time. GCUs are formed from multiple erasure blocks to provide larger data spaces that are allocated and erased as a unit. Planes are subdivisions of a die that can carry out concurrent operations to the same die.

GCUs are often arranged to span a plural number N dies, such as 16 dies, 32 dies, etc. Data payloads are presented for writing to the GCUs by generating code words, with each code word sized to nominally fit in a page. Each code word includes a user data portion and code bits (such as low density parity codes, LDPC) for error detection and correction purposes. The payloads are written by writing code words to N−1 of the dies, followed by the writing of an outercode to the Nth die. The outercode may take the form of parity data which was generated by logically combining the payload data using a suitable combinatorial function, such as an exclusive-or (XOR) function. In this way, the payload data can be recovered in the event of a die failure (e.g., the data from one of the dies cannot be recovered after writing).

While operable, a problem can arise when a payload does not equal the number of dies being written, so that there are one or more payload data elements that are left over after rotating through the die set some integer number of passes. Such uneven sized payloads can arise based on a number of factors such as data compression, the generation of map data to describe different numbers of blocks, etc. Uneven sized payloads can also arise if a die failure occurs so that a GCU now has less than a standard number of dies.

Various embodiments of the present disclosure are directed to an apparatus and method for managing non-standard sized payloads in a data storage device, such as an SSD. As explained below, some embodiments provide a method for writing payloads to multiple multi-block regions, such as semiconductor dies, such that a parity value (outercode) is generated for each pass through the regions (e.g., dies).

When leftover, or "runt" payload elements remain, the runt payload elements are written to as many additional regions as required, followed by the writing of a final parity value in the next region in the sequence to protect the runt payload elements. In this way, a standard parity data set is provided for each pass through the regions, and a non-standard parity data set is provided to protect the remainder. This scheme will protect the data up to a maximum of one region failure.

While various embodiments will be described as distributing the parity elements on a die basis, such is illustrative but not necessarily required. The embodiments can be applied to other groupings of memory regions such as at the semiconductor plane level, semiconductor chip level, etc.

These and other features and advantages of various embodiments can be understood beginning with a review of FIG. 1 which provides a simplified functional block diagram of a data storage device 100. The device 100 has a controller 102 and a memory module 104.

The controller block 102 represents a hardware based and/or programmable processor based circuit configured to provide top level communication and control functions. The memory module 104 includes solid state non-volatile memory (NVM) for the storage of user data from a host device.

Figure 2:
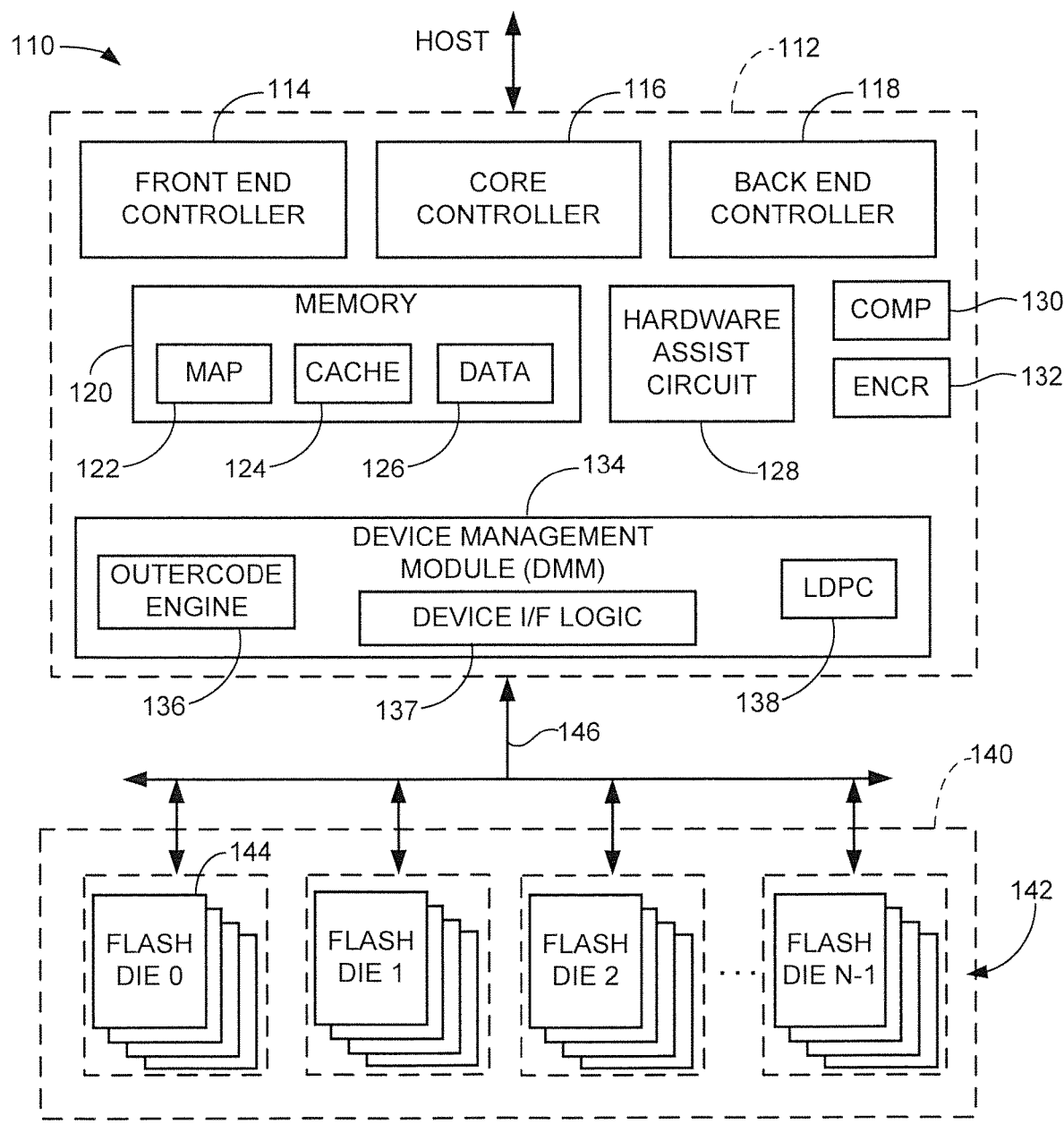
FIG. 2 shows aspects of the device of FIG. 1 characterized as a solid state drive (SSD) in accordance with some embodiments.

FIG. 2 shows a data storage device 110 generally corresponding to the device 100 in FIG. 1. The device 110 is configured as a solid state drive (SSD) that communicates with one or more host devices via one or more Peripheral Component Interface Express (PCIe) ports, although other configurations can be used. The NVM is contemplated as comprising NAND flash memory, although other forms of solid state non-volatile memory can be used. In at least some embodiments, the SSD operates in accordance with the NVMe (Non-Volatile Memory Express) Standard, which enables different users to allocate NVMe sets (die sets) for use in the storage of data. Each NVMe set may form a portion of an NVMe Namespace that may span multiple SSDs or be contained within a single SSD.

The SSD 110 includes a controller circuit 112 with a front end controller 114, a core controller 116 and a back end controller 118. The front end controller 114 performs host I/F functions, the back end controller 118 directs data transfers with the memory module 114 and the core controller 116 provides top level control for the device.

Each controller 114, 116 and 118 includes a separate programmable processor with associated programming (e.g., firmware, FW) in a suitable memory location, as well as various hardware elements to execute data management and transfer functions. This is merely illustrative of one embodiment; in other embodiments, a single programmable processor (or less/more than three programmable processors) can be configured to carry out each of the front end, core and back end processes using associated FW in a suitable memory location. A pure hardware based controller configuration can also be used. The various controllers may be integrated into a single system on chip (SOC) integrated circuit device, or may be distributed among various discrete devices as required.

A controller memory 120 represents various forms of volatile and/or non-volatile memory (e.g., SRAM, DDR DRAM, flash, etc.) utilized as local memory by the controller 112. Various data structures and data sets may be stored by the memory including one or more map structures 122, one or more caches 124 for map data and other control information, and one or more data buffers 126 for the temporary storage of host (user) data during data transfers.

A non-processor based hardware assist circuit 128 may enable the offloading of certain memory management tasks by one or more of the controllers as required. The hardware circuit 128 does not utilize a programmable processor, but instead uses various forms of hardwired logic circuitry such as application specific integrated circuits (ASICs), gate logic circuits, field programmable gate arrays (FPGAs), etc.

Additional functional blocks can be realized in hardware and/or firmware in the controller 112, such as a data compression block 130 and an encryption block 132. The data compression block 130 applies lossless data compression to input data sets during write operations, and subsequently provides data de-compression during read operations. The encryption block 132 provides any number of cryptographic functions to input data including encryption, hashes, decompression, etc.

A device management module (DMM) 134 supports back end processing operations and may include an outer code engine circuit 136 to generate outer code, a device I/F logic circuit 137 and a low density parity check (LDPC) circuit 138 configured to generate LDPC codes as part of the error detection and correction strategy used to protect the data stored by the by the SSD 110.

A memory module 140 corresponds to the memory 104 in FIG. 1 and includes a non-volatile memory (NVM) in the form of a flash memory 142 distributed across a plural number N of flash memory dies 144. Rudimentary flash memory control electronics (not separately shown in FIG. 2) may be provisioned on each die 144 to facilitate parallel data transfer operations via one or more channels (lanes) 146.

Figure 3:
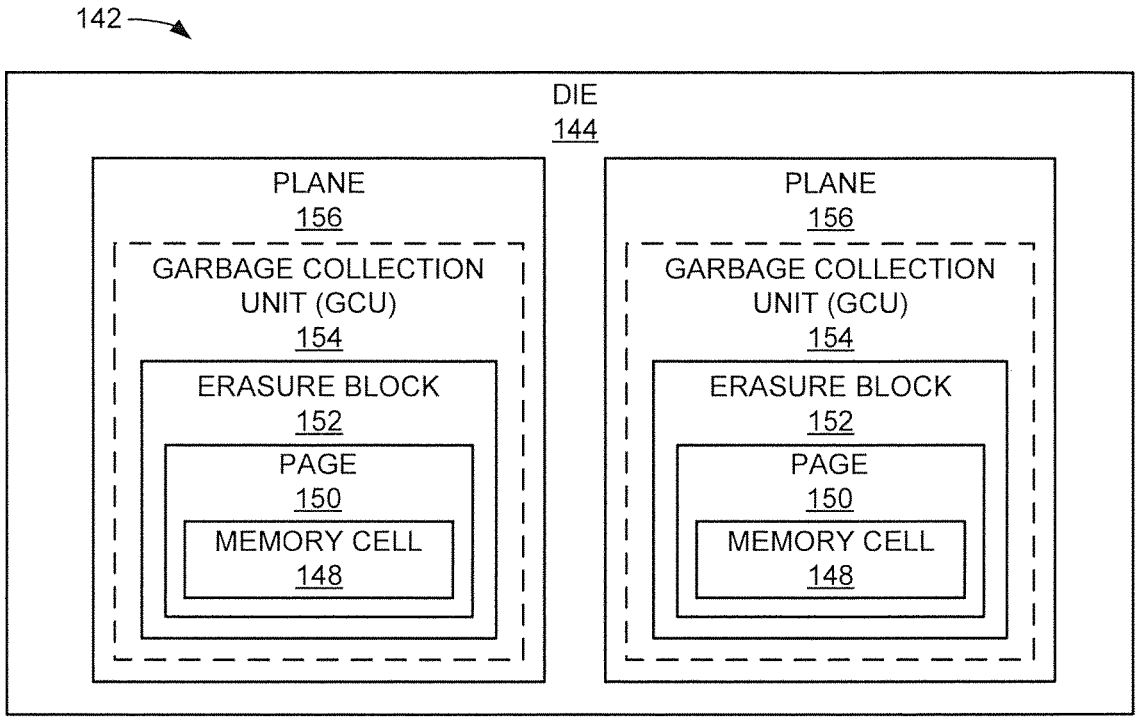
FIG. 3 shows an arrangement of the flash memory of FIG. 2 in some embodiments.

FIG. 3 shows a physical/logical arrangement of the various flash memory dies 144 in the flash memory 142 of FIG.

2 in some embodiments. Each die 144 incorporates a large number of flash memory cells 148. The cells may be arrayed in a two-dimensional (2D) or three-dimensional (3D stacked) arrangement with various control lines (e.g., source, bit, word lines) to access the cells. Each cell stores a programmed state in relation to an amount of accumulated charge.

Groups of cells 148 are interconnected to a common word line to accommodate pages 150, which represent the smallest unit of data that can be accessed at a time. Depending on the storage scheme, multiple pages of data may be written to the same physical row of cells, such as in the case of MLCs (multi-level cells), TLCs (three-level cells), XLCs (four-level cells), and so on. Generally, n bits of data can be stored to a particular memory cell 148 using $2^n$ different charge states (e.g., TLCs use eight distinct charge levels to represent three bits of data, etc.). The storage size of a page can vary; some current generation flash memory pages are arranged to store 16 KB (16,384 bytes) of user data.

The memory cells 148 associated with a number of pages are integrated into an erasure block 152, which represents the smallest grouping of memory cells that can be concurrently erased in a NAND flash memory. A number of erasure blocks 152 are turn incorporated into a garbage collection unit (GCU) 154, which are logical storage units that utilize erasure blocks across different dies as explained below. GCUs are allocated and erased as a unit.

During operation, a selected GCU is allocated for the storage of user data, and this continues until the GCU is filled. Once a sufficient amount of the stored data is determined to be stale (e.g., no longer the most current version), a garbage collection operation can be carried out to recycle the GCU. This includes identifying and relocating the current version data to a new location, followed by an erasure operation to reset the memory cells to an erased (unprogrammed) state. The recycled GCU is returned to an allocation pool for subsequent allocation to begin storing new user data. In one embodiment, each GCU 154 nominally uses a single erasure block 152 from each of a plurality of dies 144, such as 32 dies.

Each die 144 may further be organized as a plurality of planes 156. Examples include two planes per die as shown in FIG. 3, although other numbers of planes per die, such as four planes per die, etc. can be used. Generally, a plane is a subdivision of the die 144 arranged with separate read/write/erase circuitry such that a given type of access operation (such as a write operation, etc.) can be carried out simultaneously by each of the planes to a common page address within the respective planes.

Figure 4:
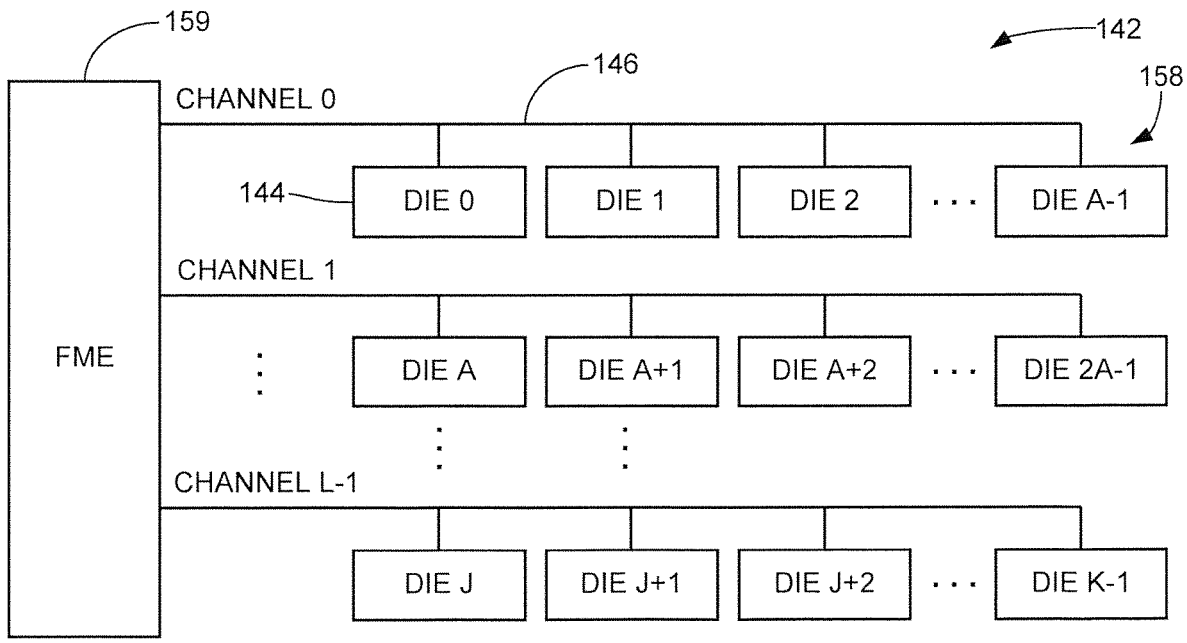
FIG. 4 illustrates the use of channels to access the dies in FIG. 3 in some embodiments.

FIG. 4 shows further aspects of the flash memory 142 in some embodiments. A total number K dies 144 are provided and arranged into physical die groups 158. Each physical die group 158 is connected to a separate channel 146 using a total number of L channels. In one example, K is set to 128 dies, L is set to 8 channels, and each physical die group has 16 dies. As noted above, a single die within each physical die group can be accessed at a time using the associated channel. A flash memory electronics (FME) circuit 159 of the flash memory module 142 controls each of the channels 146 to transfer data to and from the dies 144.

Figure 5:
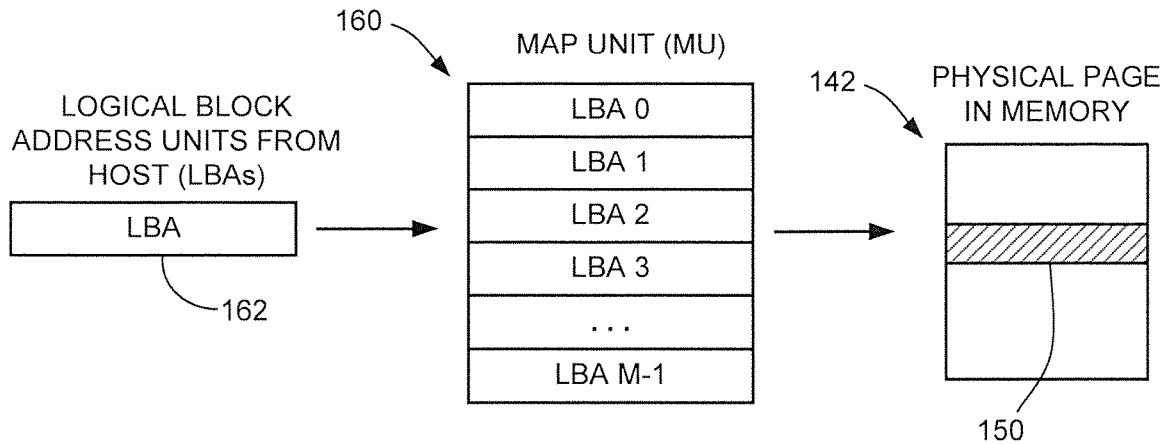
FIG. 5 illustrates a map unit (MU) as a data arrangement stored to the flash memory of FIG. 2.

FIG. 5 illustrates a manner in which data may be stored to the flash memory module 142. Map units (MUs) 160 represent fixed sized blocks of data that are made up of one or more user logical block address units (LBAs) 162 supplied by the host. Without limitation, the LBAs 162 may have a first nominal size, such as 512 bytes (B), 1024 B (1 KB), etc., and the MUs 160 may have a second nominal size, such as 4096 B (4 KB), etc. The application of data compression may cause each MU to have a smaller size in terms of actual bits written to the flash memory 142.

The MUs 160 are arranged into the aforementioned pages 150 (FIG. 3) which are written to the memory 142. In the present example, using an MU size of 4 KB, then nominally four (4) MUs may be written to each page 150. Other configurations can be used. To enhance data density, multiple pages worth of data may be written to the same flash memory cells connected to a common control line (e.g., word line) using multi-bit writing techniques; MLCs (multi-level cells) write two bits per cell, TLCs (three-level cells) write three bits per cell; XLCs (four level cells) write four bits per cell, etc.

Data stored by an SSD are typically protected using two different error protection schemes: inner codes and outer codes. Inner codes may take the form of LDPC (low density parity check) codes or similar which are written to the same flash pages as the regular user data. It is common to divide up each page as an integer number of code words, with each code word having a selected number of user data bits followed by another number of inner code bits. During a data read operation, the desired number of code words are retrieved, and the inner code bits are used to bit errors in the user data portions of the retrieved code words.

Outer codes are stored elsewhere in the flash memory and may be arranged as parity codes (values) to detect and correct errors over multiple pages, such as in a manner similar to existing RAID (redundant arrays of independent disks) parity striping techniques. If uncorrectable errors are detected during a read operation and these errors cannot be successfully recovered using the inner codes, after various retry and recovery operations the controller may ultimately direct reconstruction and recovery of the requested data using the outer codes.

Under normal operational conditions, the inner codes and other read recovery techniques are usually sufficient to enable correction and recovery of the data stored by the flash. The outer codes are only employed in those cases where the errors cannot otherwise be resolved. Invoking the outer codes can add significant time delays and can consume substantial processing resources based on the fact that a large amount of data needs to be retrieved and processed to recover the desired page(s). The use of outer codes also necessarily reduces the amount of available OP (overprovisioning) in the flash memory for a given user data storage capacity.

Figure 6:
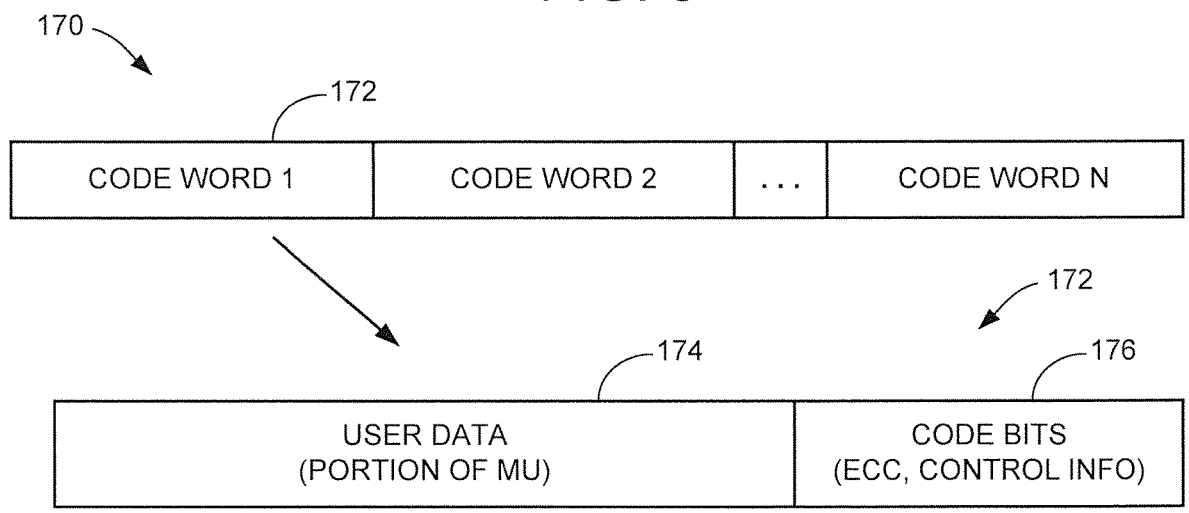
FIG. 6 shows an arrangement of code words having a user data payload and inner codes.

FIG. 6 shows an arrangement of data 170 written to a selected page 150 as an integer number of code words 172 of selected length. Each code word 172 includes a user data portion 174 and a code bit portion 176. The user data portion stores bits from one or more of the MUs 160 of FIG. 5. The code bit portion stores the LDPC or other error correction code (ECC) code bits as well as other control information associated with the user data bits. In the present embodiment, it will be understood that the code bits in the code bit portion 176 are written as inner code bits at a selected inner code rate to provide at least a desired BER for the user data bits in portion 174.

Figure 7:
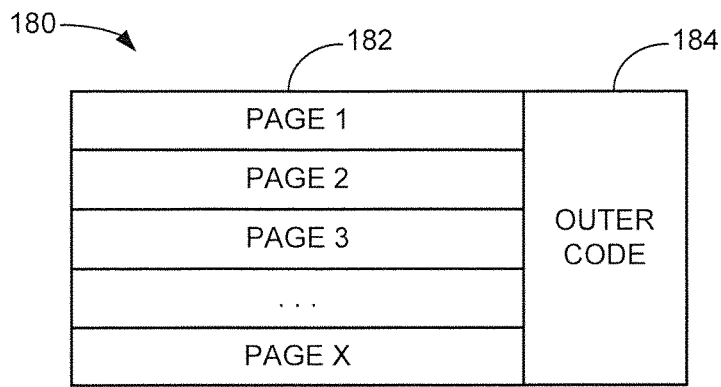
FIG. 7 shows an arrangement of outer codes used to protect a group of code words from FIG. 6.

FIG. 7 is a diagrammatical representation of a parity data set 180 made up of a plural number X data pages 182 that are protected by an outer code block 184. Each page 182 is formed of multiple code words 172 as in FIG. 6 and may be written at a selected location in a garbage collection unit (GCU) across multiple dies 144 (FIG. 2). The outer code block 184 represents parity values that enable the system to reconstruct the contents of one or more of the pages 182. For reference, the entire set of data represented by the parity data set 180 is also sometimes referred to as a payload, and each of the individual elements are also referred to as payload elements; more specifically, the pages 182 are also referred to as data payload elements and the outer code 184 is also referred to as a parity value or a parity payload element.

While not limiting, RAID type parity value techniques can be used to calculate the outer code parity values, such as through an exclusive-or (XOR) combination of the data payload elements protected by the parity value. In one embodiment, the outer code block 174 occupies essentially an entire page, so that X is some multiple number of pages and a code rate of 1/X is provided by the outer code. This is not limiting as the outer code can occupy any suitable amount of space in the flash memory, including less than or more than a page for a given parity set.

Figure 8:
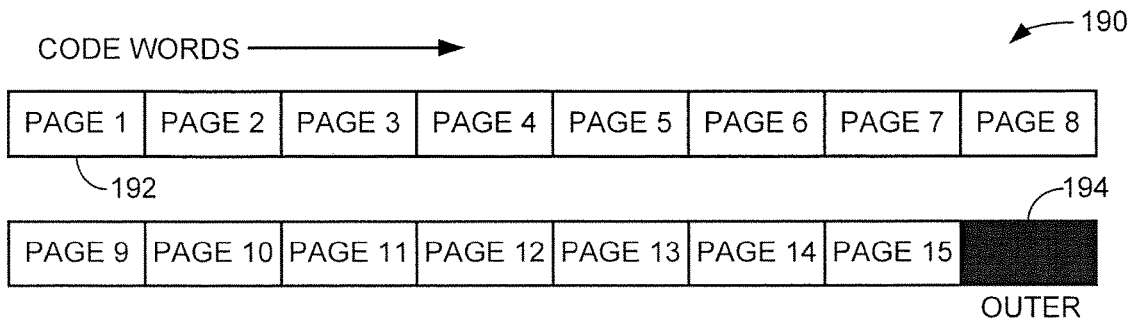
FIG. 8 illustrates a standard parity data set aligned with die boundaries in some embodiments.

FIG. 8 illustrates a manner in which a parity data set 190 can be written to a selected GCU 154 in the flash memory 142 in accordance with some embodiments. Referring again to FIG. 3, in this example the selected GCU 154 is formed from sixteen (16) erasure blocks 152, with each of the erasure blocks disposed on a different die 144. Other sizes and arrangements can be used as desired.

In FIG. 8, the parity data set 190 has fifteen (15) user data pages (data payload elements) 192 respectively referred to as Page 1 to Page 15. Each data payload element 192 is written to a different die 144. More generally, the GCU has N erasure blocks on a corresponding N dies, and N−1 data payload elements are respectively written to N−1 of the erasure blocks on N−1 of the dies.

The Nth die receives an outer code (parity value) 194. As mentioned above, the outer code may be generated by summing the page data in a buffer using an XOR function. The parity data set 190 has data boundaries that nominally match the GCU boundaries, that is, the number of dies N equals the total number of elements in the payload P (N=P=16). On this basis, the parity data set 190 in FIG. 8 is referred to as a standard parity data set. In this arrangement, the next parity data set will begin in the same erasure block that stores Page 1.

Figure 9:
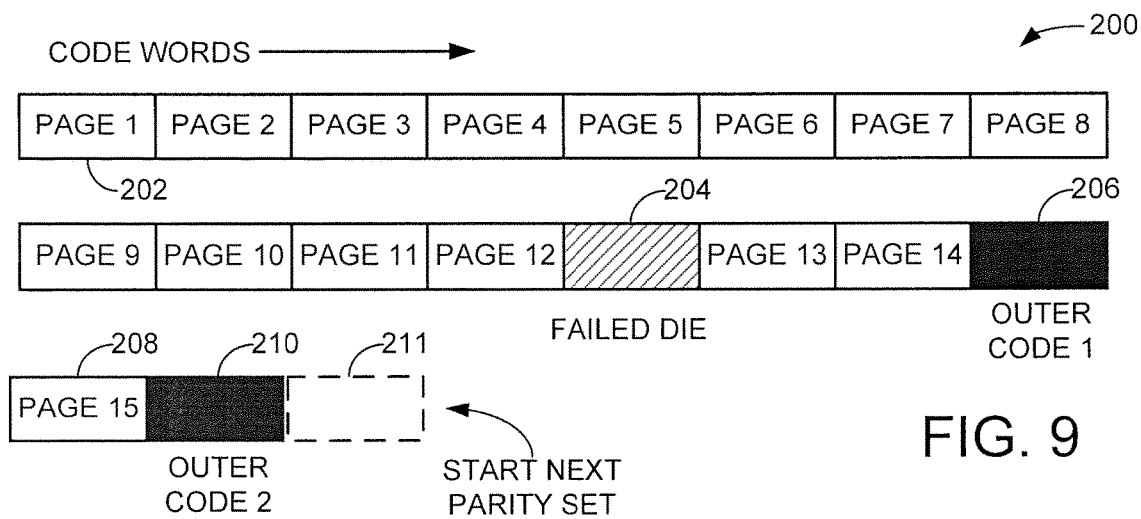
FIG. 9 illustrates a non-standard parity data set that does not align with die boundaries in some embodiments.

FIG. 9 shows a non-standard parity data set 200. The parity data set 200 is the same size as the parity data set 190 in FIG. 8 in that, as before, the parity data set 200 has a total of fifteen (15) data payload elements 202. However, one of the dies 144 has experienced a failure, as indicated at 204, so that the GCU only spans 15 dies.

The controller circuit 112 (FIG. 2) operates to write a full set of the available data payload elements, which in this case corresponds to Page 1 to Page 14, through the available dies. This is followed by the writing of a first outer code (parity value) in the Nth location, as shown at 206, which protects Page 1 to Page 14 written during this first pass through the available dies.

A leftover data payload element 208 (Page 15) is written to the next available page in the first die (such as adjacent Page 1). This leftover payload element is referred to as a runt or runt data, and represents the remainder after a complete pass has been made through the available dies. Once all of the leftover data payload elements have been written, a second outer code (parity value) is written in the next available die, as shown at 210. This second outer code is disposed in the same die as, and is adjacent to, the Page 2 payload.

The entire payload 200 can thus be thought of as comprising a standard parity data set (Pages 1-14 plus outer code 1) and a non-standard parity data set (Page 15 plus outer code 2). More generally, when leftover (runt) payload elements remain, these are written to as many additional dies as are required, followed by the writing of a final parity value to cover the runts. Map data may be generated to note the non-standard outer code arrangement. This provides a parity data set with a parity value to protect the pass through the dies, plus another parity value to cover the remainder.

While FIG. 9 shows the non-standard parity data set has arisen due to a non-standard sized available memory (e.g., due to the die failure at 204), other non-standard parity data sets can arise based on other factors. For example, a particular data set to be written to a given NVMe set may make up a total number of MUs that do not align with the GCU boundaries. In another case, data compression or other processing may result in a non-standard sized parity data set. It will be appreciated that if a given GCU has N dies, then a non-standard sized data set will have a total number M payload elements (or portions thereof) that are not divisible by N without a remainder. The remainder could be any value from one extra payload element up to N−1 extra payloads. Regardless, each pass through the dies will be parity protected, irrespective of the overall length of the parity data set.

Once a non-standard parity set is written, the control circuit generates map data to indicate the fact that the parity data set is of non-standard length. The control circuit may include information in the map data such as how much longer the data set is in terms of additional pages in the remainder, the location of the last parity value (e.g., outer code 2 at 210), etc. To maximize data density, the controller may operate to initiate the writing of the next parity data set at the next available page on the next die in the sequence, as shown at 211 in FIG. 9. The operation of the controller circuit in forming and identifying non-aligned payload/GCU boundaries reduces write amplification and eliminates the need for dummy filler data to maintain boundary alignments.

It follows from FIG. 9 that if a parity data set with P payload elements is scheduled to be written to a storage space having N multi-block regions of the memory, and P is greater than N (P>N), then at least one of the multi-block regions will store at least two of the payload elements as the parity data set wraps through the N regions. This can be seen in FIG. 9 for pages 1 and 15, both of which are stored in the same semiconductor die. Since the outer code 1 only protects against the loss of a single payload element in each of the N dies, the loss of the first die would not enable recovery of the full parity data set 200 because the Page 15 element would be lost. This problem is solved by the use of the second outer code (outer code 2) value 210, which protects Page 15.

At this point it will be appreciated that the designator P has been used to include all of the elements (both data and parity) in a given parity data set. Another way to describe the system is to use the designator D to represent the total number of data parity elements (e.g., pages) in the data set. Since one parity value is applied for each wrap through the N regions, P=D+1 and a non-standard parity set will arise if D is equal to or greater than N.

Figure 10:
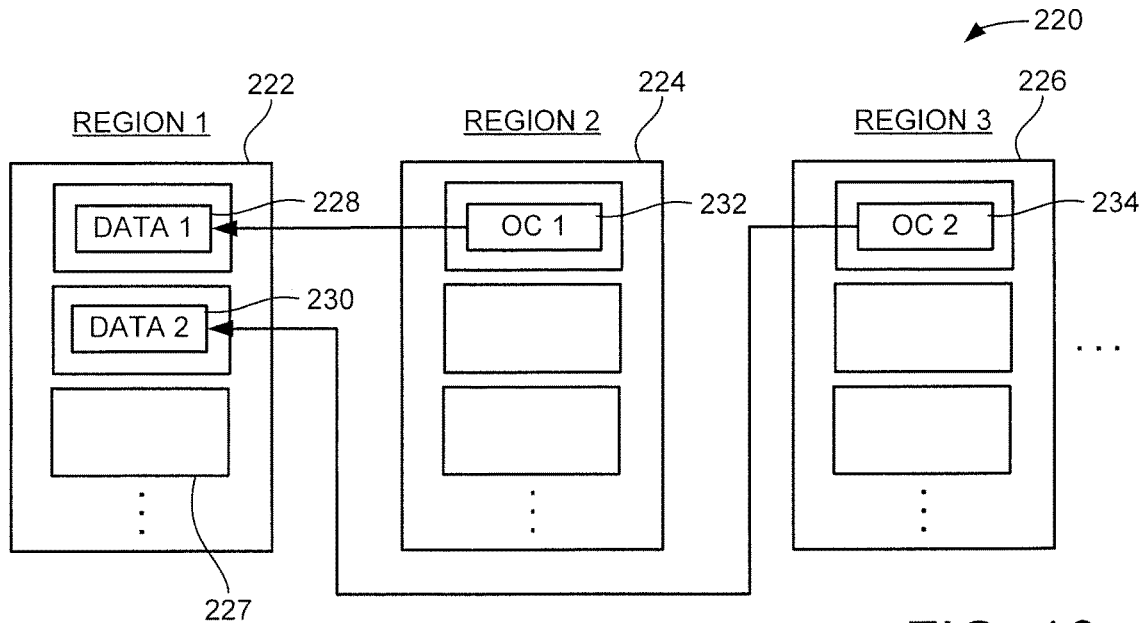
FIG. 10 schematically represents the writing of data and parity values to multiple regions in a memory in further embodiments.

FIG. 10 shows a schematic diagram for the storage of another non-standard parity data set 220 across different regions of the flash memory in some embodiments. As before, the data set 220 has P total payload elements and N total available regions. The regions can be semiconductor dies as discussed above but may instead by other divisions within the flash memory capable of storing multiple elements such as planes, arrays, IC chips, etc. The regions include three regions 222, 224 and 226, respectively denoted as Regions 1-3. Each region has multiple blocks of physical memory 227, such as erasure blocks, to which the various elements of the parity data set can be stored.

A first data payload element 228 and a second data payload element 230 are both stored in the first region 222 (Region 1). These elements are respectively denoted as Data 1-2. A first parity value (outer code) payload element 232 is stored in the second region 224 (Region 2) and denoted as OC1. A second parity value (outer code) payload element 234 is stored in the third region 226 (Region 3) and denoted as OC 2. The first parity value (OC1) 232 protects the first N−1 data payload elements, including the first data payload element 228 (Data 1). The second parity value (OC2) protects the remaining P-(N−1) data payload elements, including the second data payload element 230 (Data 2).

Because of the non-standard (non-aligned) nature of the parity data set 220 (e.g., P>N), the OC1 and OC2 parity values 232, 234 will necessarily be stored in different regions, and the entire data contents of the data set can be recovered regardless of the loss of any one of the regions.

The embodiments presented thus far have used a single parity value to protect a range of data payload elements, and is designed to survive the loss of a single region. Other parity schemes are contemplated, including schemes that use multiple parity values to provide protection against the simultaneous loss of multiple regions. However, in the context of a semiconductor memory, it has been found sufficient in most cases to protect against the loss of only a single region, such as a single die, at a time.

Figure 11:
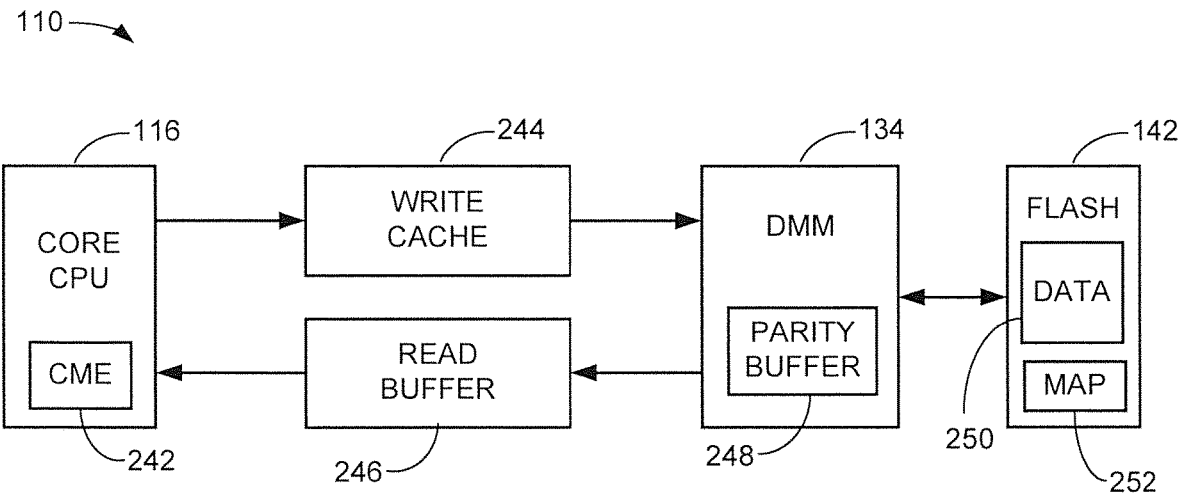
FIG. 11 shows further aspects of the SSD of FIG. 2.

FIG. 11 shows a functional block representation of additional aspects of the SSD 110 in some embodiments. The core CPU 116 from FIG. 2 is shown in conjunction with a code management engine (CME) 242 that can be used to manage the generation of the respective code words and outer code parity values for both standard and non-standard parity data sets During write operations, input write data from the associated host are received and processed to form MUs 160 (FIG. 3) which are placed into a non-volatile write cache 244 which may be flash memory or other form(s) of non-volatile memory. The MUs are transferred to the DMM circuit 134 for writing to the flash memory 142 in the form of code words 172 as described above. During read operations, one or more pages of data are retrieved to a volatile read buffer 246 for processing prior to transfer to the host.

The CME 242 determines the appropriate inner and outer code rates for the data generated and stored to memory. In some embodiments, the DMM circuit 134 may generate both the inner and outer codes. In other embodiments, the DMM circuit 134 generates the inner codes (see e.g., LDPC circuit 146 in FIG. 2) and the core CPU 116 generates the outer code words. In still other embodiments, the same processor/controller circuit generates both forms of code words. Other arrangements can be used as well. The CME 212 establishes appropriate code rates for both types of code words.

During generation of the outer codes, a parity buffer 248 may be used to successively XOR each payload element being written during each pass through the dies. Both payload data 250 and map data 252 will be stored to flash 142.

Figure 12:
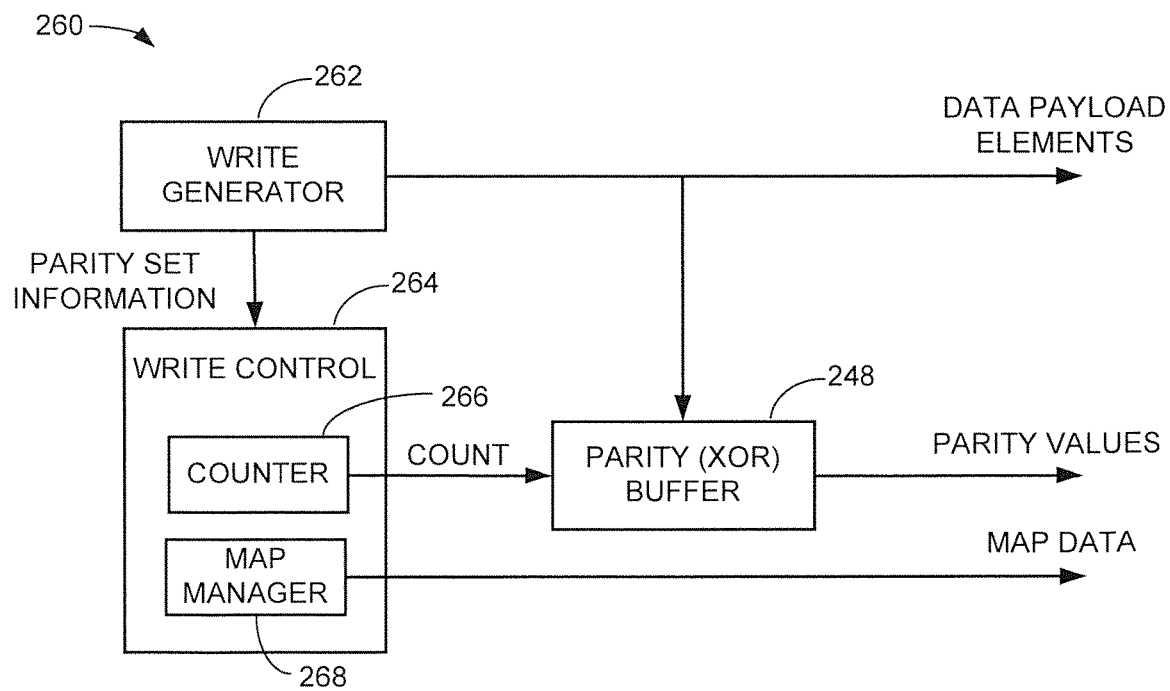
FIG. 12 is a functional representation of write controller circuitry of FIG. 11 in some embodiments.

FIG. 12 shows a functional block representation of write controller circuitry 260 of the SSD 110 in further embodiments. Aspects of the circuitry 260 can be incorporated into the DMM 134, or other portions of the SSD.

To write a parity data set to the flash memory 142, a write generator 262 divides the contents of the set into a sequence of data payload elements as discussed above, which are transmitted for storage to the associated GCU or other storage space. Parity set information including the size and address of the parity set is provided to a write control unit 264, which includes a counter circuit 266 and a map manager circuit 268.

As the data payload elements are forwarded by the write generator 262, the elements are combined in turn using an XOR operation in the parity buffer 248, as counted by the counter circuit 266. When the designated number of elements have been combined, the corresponding parity value is output and inserted into the write stream for writing to the flash memory. The map manager 268 tracks the locations of the parity values and outputs the map data updates which are also stored in an appropriate location in the flash.

Figure 13:
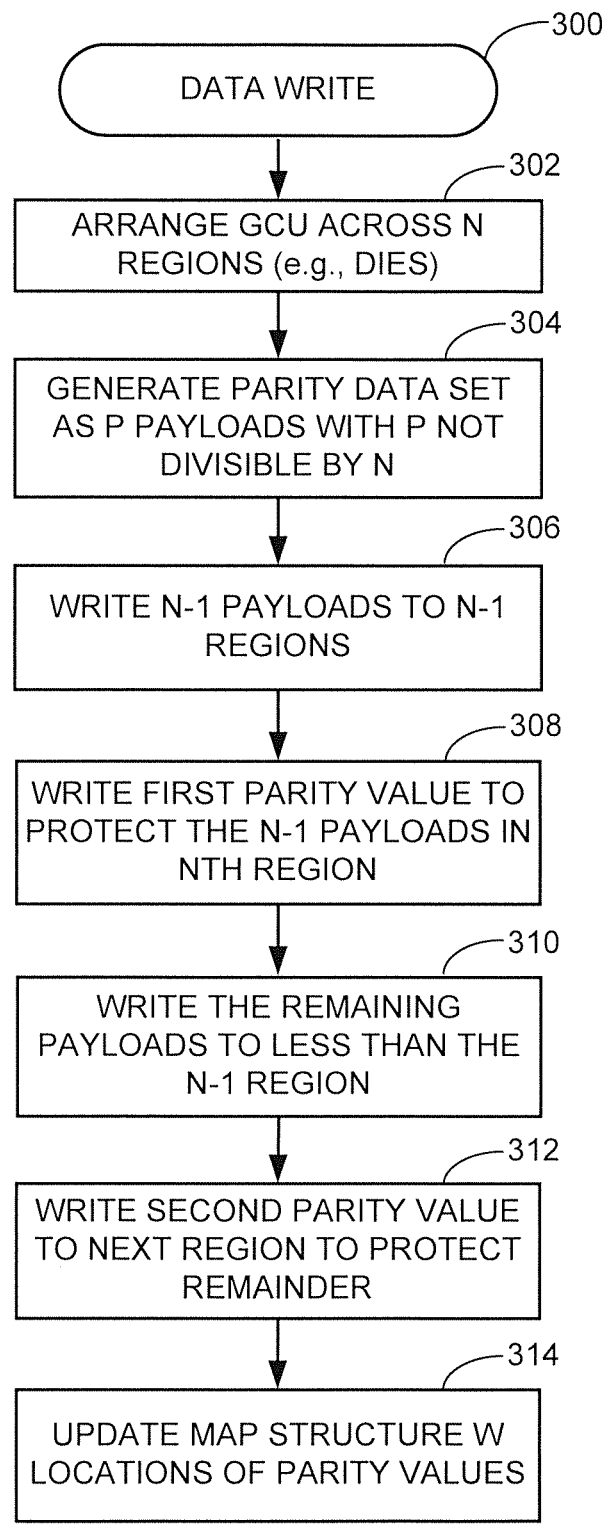
FIG. 13 is a data write routine to illustrate various steps that may be taken to write a non-standard parity data set in accordance with some embodiments.

FIG. 13 is a data write routine 300 to illustrate the writing of a non-standard sized parity data set to a memory such as the flash memory 142 in some embodiments.

Initially, the flash memory is arranged at step 302 to provide a GCU 154 across a plural number N dies 144 (or other regions of the memory). A parity data set is generated at step 304 as a plural number P payloads, where P is not a multiple of N; that is, dividing P by N results in some integer value plus a remainder less than N.

At step 306, the first N−1 payloads are written to N−1 dies within the GCU. A first parity value is generated and written to the Nth die within the GCU at step 308, with the parity value configured to enable recovery of any of the payloads as a result of at least one die failure or other error event.

At step 310, the remaining payloads (runts) are written to some number of less than the N−1 dies. It is contemplated that the writes will continue in sequence from die 1 to die N as discussed above, although other arrangements can be used.

A second parity value is generated and written to the next available die at step 312. The second parity value protects the remaining payloads written during step 310. Finally, a map structure in a memory location is updated to identify the respective first and second parity values, as well as other control information as desired to enable the non-standard parity set to be subsequently retrieved and returned to a requesting host.

It is to be understood that even though numerous characteristics and advantages of various embodiments of the present disclosure have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. A method comprising:
arranging a distributed storage space of a non-volatile memory (NVM) into blocks across a plural number of regions (N); and
writing a non-standard parity data set to the distributed storage space having a plural number of data elements (D) greater than or equal to the plural number of regions, by storing a first portion of the data elements and a first parity value to the plural number of regions and a remaining portion of the data elements and a second parity value to a subset of the plural number of regions.

2. The method of claim 1, wherein the plural number of data elements (D) in the parity data set plus the first parity value constitute P elements where D, N, and P are integers and N<P<2N.

3. The method of claim 2, wherein the first portion of the data elements comprises N−1 data elements written to each of N−1 regions, and the remaining portion of the data elements comprises D−N elements written to the subset of the plural number of regions.

4. The method of claim 1, wherein each region of the plural number of regions comprises a semiconductor die of the NVM and the distributed storage space comprises a garbage collection unit (GCU) which spans the plural number of dies in the NVM.

5. The method of claim 4, wherein the NVM comprises flash memory.

6. The method of claim 1, further comprising updating a map as a data structure in a memory that identifies a location of the first parity value and a location of the second parity value in the NVM.

7. The method of claim 1, wherein each of the data elements comprises a selected amount of user data and an inner code configured to detect and correct bit errors in the user data during a read operation, and wherein each of the first and second parity values comprise an outer code configured to reconstruct an associated number of the data elements responsive to an unavailability condition associated with a selected one of the regions.

8. The method of claim 1, wherein the first parity value is determined in response to an exclusive-or (XOR) combination of the first portion of the data elements, and the second parity value is determined in response to an XOR combination of the remaining portion of the data elements.

9. The method of claim 1, wherein the NVM is characterized as a flash memory in a solid-state drive (SSD).

10. A method comprising:
forming a garbage collection unit (GCU) into blocks across a plural number of dies (N) characterized as semiconductor non-volatile memory (NVM) dies;
dividing a data set into a plural number of data elements (D) equal to or greater than the plural number of dies (N);
combining a first portion of the data elements to form a first parity value and distributing the first portion of the data elements and the first parity value across the plural number of dies;
combining a remaining second portion of the data elements to form a second parity value and distributing the remaining second portion of the data payload elements and the second parity value across less than the plural number of dies; and
writing map data to a memory to describe the locations of the first and second parity elements among the plural number of dies.

11. The method of claim 10, wherein D≥N, wherein the first portion of the data elements comprise N−1 data elements and the remaining second portion of the data elements comprise D−(N−1) elements, and wherein the first and second parity values are written to different dies.

12. The method of claim 10, wherein each of the data elements comprises a selected amount of user data and an inner code configured to detect and correct bit errors in the user data during a read operation, and wherein each of the first and second parity values comprises an outer code configured to reconstruct an associated number of the data elements responsive to an unavailability condition associated with a selected one of the NVM dies.

13. The method of claim 12, wherein the first parity value is determined in response to an exclusive-or (XOR) combination of the first portion of the data elements, and the second parity value is determined in response to an XOR combination of the second portion of the data elements.

14. The method of claim 10, wherein the NVM dies form a flash memory in a solid-state drive (SSD).

15. A data storage device comprising:
a non-volatile memory (NVM) comprising semiconductor dies arranged into blocks of at least one garbage collection unit (GCU), the at least one GCU comprising an erasure block selected from each of a plural number of the dies (N);
a controller circuit configured to write a non-standard parity data set having a plural number of data elements (D) greater than or equal to the plural number of the dies by storing an initial set of the data elements and a first parity value to each of the plural number of the dies and by storing a remaining set of the data elements and a second parity value to a subset of the dies, the first parity value protecting the initial set of the data elements and the second parity value protecting the remaining set of the data elements.

16. The data storage device of claim 15, characterized as a solid-state drive (SSD), wherein the semiconductor dies comprise flash memory dies.

17. The data storage device of claim 15, wherein the controller circuit is further configured to update a map as a data structure in a memory to identify a first address in the corresponding die at which the first parity value is stored and to identify a second address in the corresponding die at which the second parity value is stored.

18. The data storage device of claim 15, wherein each of the data elements comprises a selected amount of user data and an inner code configured to detect and correct bit errors in the user data during a read operation, and wherein each of the first and second parity values comprises an outer code configured to reconstruct an associated number of the data elements responsive to an unavailability condition associated with a selected one of the regions.

19. The data storage device of claim 15, wherein the first parity value is determined in response to an exclusive-or (XOR) combination of the initial set of the data elements, and the second parity value is determined in response to an XOR combination of the remaining set of the data elements.

20. The data storage device of claim 15, wherein the control circuit is further configured to initially establish the at least one GCU as having M dies where M=N+1, wherein the control circuit reduces the size of the at least one GCU to N dies responsive to a failure of one of the M dies, and wherein the parity data set has D data elements where D≥N.

* * * * *